United States Patent [19]

Bianchin et al.

[11] 4,096,087
[45] Jun. 20, 1978

[54] ELECTROCHROMIC AND PHOTOCHROMIC MATERIAL AND A METHOD OF FABRICATION OF SAID MATERIAL

[75] Inventors: Christian Bianchin, Saint Martin d'Heres; Alain Deneuville, Vis; Philippe Gerard, Saint Martin de la Cluze, all of France

[73] Assignees: Commissariat a l'Energie Atomique; Agence Nationale de Valorisation de la Recherche (ANVAR), both of Paris, France

[21] Appl. No.: 775,374

[22] Filed: Mar. 7, 1977

[30] Foreign Application Priority Data

Mar. 19, 1976  France .................................. 76 08034

[51] Int. Cl.² .................................................. G02B 5/23
[52] U.S. Cl. .................................. 252/300; 204/192 P
[58] Field of Search .................... 252/300; 350/160 R; 204/192 P

[56] References Cited

U.S. PATENT DOCUMENTS 3,521,941  7/1970  Deb et al. ......................... 350/160 R
3,829,196  8/1974  Deb ................................... 350/160 R

OTHER PUBLICATIONS

Faughnan, B. W., et al., "Electrochromism in $WO_3$ Amorphous Films," RCA Review, 36(1), pp. 177–197, Mar. 1975.

Bailar, J. C., et al., Eds, Comprehensive Inorganic Chemistry, Pergammon Press, Oxford, England, 1973, pp. 763–764.

Primary Examiner—Benjamin R. Padgett
Assistant Examiner—Deborah L. Kyle
Attorney, Agent, or Firm—Flynn & Frishauf

[57] ABSTRACT

The material is constituted by a sub-stoichiometric amorphous oxide doped by hydrogen corresponding to the formula $MO_xH_y$, where M is a metal of group VI such as tungsten, with $2.6 < x < 2.8$ and $0.3 < y < 0.6$. The method of fabrication of the material involves a cathodic reactive sputtering operation which is carried out by subjecting a target having a base of a metal of group VI such as tungsten or a metal oxide to an ion bombardment in the presence of a reactive gas which consists in particular of oxygen and hydrogen.

4 Claims, 1 Drawing Figure

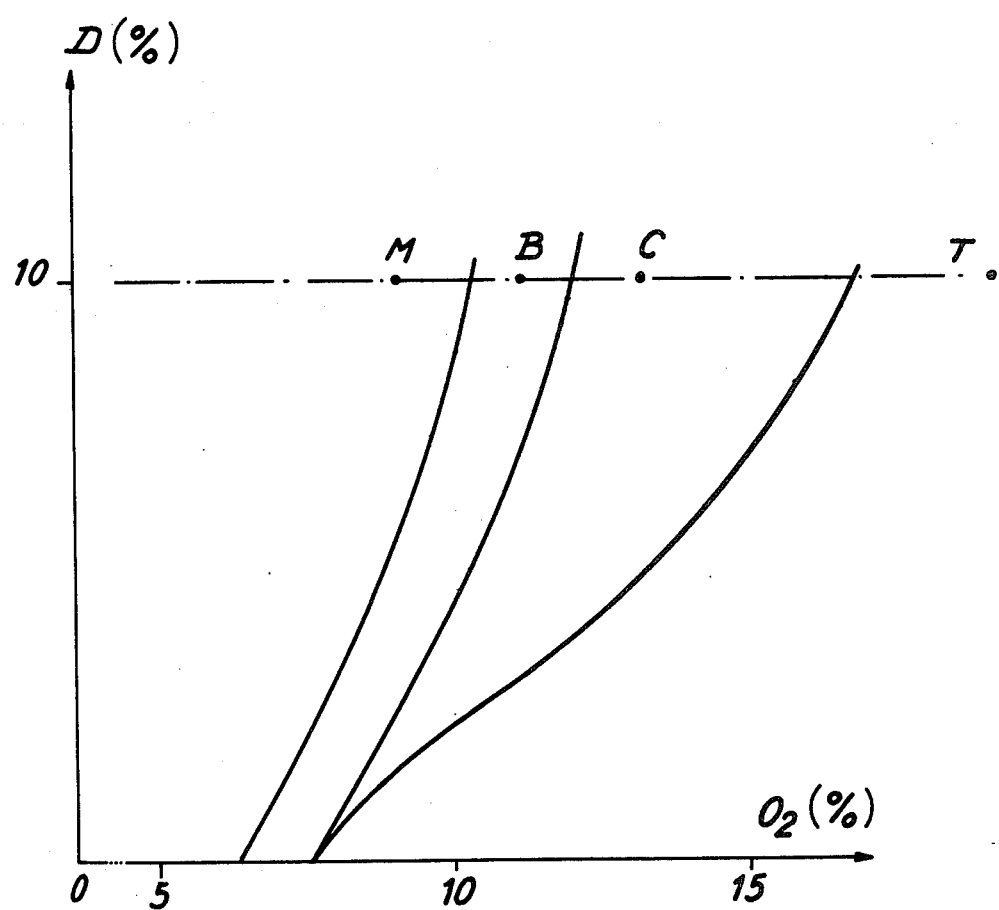

ELECTROCHROMIC AND PHOTOCHROMIC MATERIAL AND A METHOD OF FABRICATION OF SAID MATERIAL

This invention relates to an electrochromic and photochromic material and to a method of fabrication of this latter. The invention finds an application in electrooptics and especially in the display of alphanumeric characters.

Electrochromism and photochromism designate properties of certain substances which become colored or change color when they are subjected either to an electric field or to electromagnetic radiation. This phenomenon results from the appearance or the displacement of an absorption band in a portion of the optical spectrum which is usually in the red region. When the electrical or optical excitation disappears, the material remains in its excited state. This property is usually employed to advantage in order to construct character display devices or screens of variable optical density.

Many electrochromic and/or photochromic materials are already known: some are organic and others are inorganic. The inorganic class includes crystals of known types having color centers related to a phenomenon of resonant absorption between a fundamental state and an excited state of an electron trapped in an oxygen vacancy. The material in accordance with the present invention is not of this type since it is not crystalline but is, on the contrary, amorphous.

Amorphous materials are also known, however, which are electrochromic and/or photochromic and especially metal oxides such as tungstate, for example. In this connection, reference could be made by way of example to the article by S.K. Deb published in the review entitled "Applied Optics", supplement No. 3, page 192, 1969. Strictly speaking, these materials do not give rise to a displacement of an absorption band but rather to the appearance of a band of this type in the red region of the spectrum. This is the cause of the bluish hue which they exhibit either under the excitation of an electric field (of the order of $10^4$ V/cm) or under the action of ionizing radiation (for example under the action of ultraviolet light having a wavelength which is shorter than approximately 0.3 $\mu$).

Reference can also be made to U.S. Pat. No. 3,521,941 entitled "Electro-optical device having variable optical density" granted on July 28th, 1970 and U.S. Pat. No. 3,829,196 entitled "Variable light-transmission device", granted on Aug. 13th, 1974. The last-mentioned patent in particular gives a description of electrochromic materials which are oxides doped by an alkali metal which enhances the electrochromic effect. It is possible to employ a second dopant, namely silver in this instance, which has the effect of nullifying the reversibility of the phenomenon of electrochromism and which virtually acts as an inhibitor.

The present invention relates to electrochromic and photochromic materials in which the dopant is constituted by hydrogen which, surprisingly, endows said materials with remarkable properties.

Another essential feature of the materials in accordance with this invention lies in their sub-stoichiometric composition. As disclosed in particular in the U.S. Pat. No. 3,829,196 cited in the foregoing, it is known that non-stoichiometry plays a part in electrochromic properties. This non-stoichiometry is not, however, defined in a precise manner. The present Applicants have shown that a particular non-stoichiometry, namely a sub-stoichiometry, leads to remarkable results in the case of materials which are doped by hydrogen.

In more precise terms, the electrochromic and photochromic material in accordance with the invention is constituted by a sub-stoichiometric amorphous oxide doped by hydrogen corresponding to the formula $MO_xH_y$, where M is a metal of group VI, with $2.6 < x < 2.8$ and $0.3 < y < 0.6$.

A metal of group VI is understood to mean one of the metals which occupy column VI of the Periodic Table of Elements and especially chromium, molybdenum and tungsten. In order to ensure greater ease of preparation, experiments can be performed with hydrogen in the isotopic form of deuterium. The dopant can be incorporated with the oxide either in the pure form or in the form of water. The metal is preferably tungsten and the value $x$ is preferably in the vicinity of 2.7.

Although the scope of the invention does not depend in any sense on the accuracy of the explanations of a scientific nature which are given below, it may be mentioned by way of indication that the present inventors believe the following interpretation can be given to the mechanism of electrochromism and photochromism in the material according to the invention the transparency of the material would correspond to a state in which the metal of the oxide is in a valence state 5+ and the hydrogen is in a valence state 0. At the time of excitation by an electric field or by electromagnetic radiation, an "interbond" excitation would take place between metal ions from the valence state 5+ to the state 4+ and, in order to maintain electrical neutrality, a change of valence in the hydrogen would take place simultaneously in the opposite direction, that is to say from the valence state 0 to the state (+). In the case of a material constituted by a tungsten oxide doped by hydrogen, a transparent zone would therefore correspond in accordance with this interpretation to the composition $W^{5+}$, H and a colored zone would correspond to the composition $W^{5+}$, $mW^{4+}$, $mH^+$ where $m$ designates the number of tungsten atoms which have changed from a valence of 5+ to a valence of 4+ or, equivalently, the number of hydrogen atoms which have changed from the valence state 0 to the valence state (+). During the process of blanching of the material, the reverse process would take place, namely a return from the valence state 4+ to the state 5+ in the case of the metal and a return from the valence state (+) to the state 0 in the case of the dopant.

The present invention is also directed to a method of fabrication of the material which has just been described. Whereas in the prior art, the electrochromic and photochromic materials of the amorphous oxide type were usually obtained by evaporation of an oxide powder in vacuo, this invention proposes a method of fabrication which has recourse to an operation performed in the presence of a reactive-gas dopant, with the result that the concentration of dopant in the material can be adjusted with accuracy and that layers having highly reproducible properties can accordingly be obtained, which was not the case with the methods of the prior art.

In accordance with a first alternative form, the operation carried out in the presence of a reactive gas consists of cathodic sputtering. In this alternative form, a target having a base of a metal of group VI is subjected to ion bombardment in the presence of a reactive gas comprising in particular oxygen and hydrogen.

The target can be of pure metal or of metal oxide.

The method according to the invention offers many advantages, especially insofar as it serves to establish the value of deviation from stoichiometry and to adjust the concentration of dopant. In accordance with the invention, it is in fact only necessary to modify the partial pressure of oxygen which is present in the reactive mixture in order to adjust said value of deviation and to modify the partial pressure of the hydrogen in order to adjust the concentration of dopant.

By making use of these possibilities which are offered by the method in accordance with the invention, the inventors have been able to undertake an extensive study of the properties of the material as a function of the deviation from stoichiometry and of the doping process. The results thus obtained are summarized on the graph of the single FIGURE which accompanies the description. This FIGURE indicates the properties exhibited by the material as a function of the concentration of oxygen which is present in the reactive gas (the concentration being plotted as abscissae and expressed as a percentage of the total gas) and of deuterium (plotted as ordinates and also expressed as a percentage). These results correspond to a target of tungsten and to an inert gas which consists of argon. The three curves given in the FIGURE mark the boundaries between four zones: in the left-hand zone (designated by the letter M), the material has a metallic appearance; in the zone B, it has a permanent bluish appearance; it is in zone C that the properties of electrochromism and photochromism are found; in zone T located on the far right, the material has a permanent transparent appearance.

These results make it possible to adjust the partial pressure of oxygen and/or of dopant according to the appearance which it is desired to obtain. For example, if the partial pressure of deuterium in the reactive mixture is lower than 10%, a partial pressure of oxygen of 5% results in a material which has a metallic appearance. A partial pressure of the order of 11% results in a blue material but this latter does not have properties of either electrochromism or photochromism. A partial pressure of the order of 15% results in an electrochromic and photochromic material. A partial pressure of oxygen which is higher than approximately 20% results in a material which is transparent but the appearance of which cannot be modified by an electric field.

The foregoing results are not only of practical interest but serve in addition to gain a better understanding of the conditions which have to be satisfied by a material in order to be electrochromic and photochromic: in fact, it is apparent that sub-stoichiometry alone is not sufficient to give rise to electrochromism or to photochromism. Conversely, metal oxide layers can exhibit a blue color in the absence of hydrogen without necessarily possessing the desired properties. The value of deviation from stoichiometry is therefore related to the concentration of dopant and the ranges indicated earlier serve to define this relationship.

The method of preparation of the material in accordance with the invention has a further advantage as will be brought out by the following considerations. At the time of preparation of opto-electronic devices and especially display devices which make use of electrochromic material, it is necessary to insert a thin film of said material between means for applying a voltage. In order to fabricate devices of this type, it is first necessary to deposit the electrochromic material, then to deposit an insulating layer. The method of fabrication in accordance with the invention is particularly well suited to the formation of an insulating layer of this type since it is only necessary in the reactive cathodic sputtering operation to employ a reactive gas which only contains oxygen. A metal oxide layer is then obtained and the inventors have been able to establish the fact that said layer has a sufficiently high insulating capacity to be suitable for this application. These two operations can therefore be carried out one after the other and in any order within the same cathodic sputtering enclosure, thus considerably simplifying the operations involved in the manufacture of the device as a whole.

In a second alternative mode of execution of the method of fabrication according to the invention, the operation performed in the presence of a reactive gas is an evaporation process. In this variant, oxide powder is evaporated within an enclosure which contains for example either hydrogen or water at a pressure which can be adjusted, for example in the vicinity of $10^{-3}$ torr. In this alternative mode of execution as in the first, it is possible to adjust the concentration of dopant in the material by modifying the partial pressure of the hydrogen.

What we claim is:

1. Electrochromic and photochromic material, wherein said material is constituted by a sub-stoichiometric amorphous oxide doped by hydrogen corresponding to the formula $MO_xH_y$, where M is a metal of group VI, with $2.6 < x < 2.8$ and $0.3 < y < 0.6$.

2. Material according to claim 1, wherein the metal is tungsten.

3. Material according to claim 2, wherein $x$ is in the vicinity of 2.7.

4. Material according to claim 1, wherein the metal is a metal selected from the group consisting of tungsten, molybdenum and chromium.

* * * * *